US000001526H

United States Statutory Invention Registration [19]

[11] Reg. Number: H1526

[45] Published: Apr. 2, 1996

Ivey et al.

[54] HYDROPHONE PREAMPLIFIER

[75] Inventors: Larry E. Ivey; Michael T. McCord, both of Orlando, Fla.

[73] Assignee: United States of America, Washington, D.C.

[21] Appl. No.: 433,542

[22] Filed: Apr. 21, 1995

[51] Int. Cl.[6] ..... G01S 15/00

[52] U.S. Cl. ..... 367/135

[58] Field of Search ..... 367/135

*Primary Examiner*—Daniel T. Pihulic

*Attorney, Agent, or Firm*—Thomas E. McDonnell; Charles J. Stockstill

[57] ABSTRACT

A hydrophone preamplifier design utilizing hybrid integrated circuits, surface mounted components, multi-layered circuit boards and gain switching. Acoustic signals from a sensor are applied to a hybrid integrated circuit preamplifier whose gain is controlled by a relay activated remotely from a control that allows a predetermined attenuation permitting measurements of high sound pressure levels (low gain) or low ambient noise levels (high gain). The preamplifier in the hybrid integrated circuit provides a gain of 10 (20 dB) and an additional gain of 10 is provided by a low-noise operational amplifier (op amp). A current booster provides the output current drive capability for the preamplifier which is capable of driving large capacitive loads and has protection against both electrical and thermal overloads. Insertion calibration is provided through an ac current signal supplied by an external source, which develops a small voltage signal when supplied to the preamplifier. The voltage signal is coupled through an acoustic sensor to the preamplifier input providing a complete loop-back system test.

1 Claim, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HYBRID INTEGRATED CIRCUIT

HYDROPHONE PREAMPLIFIER

BACKGROUND OF THE INVENTION

1. Field of the Invention

This invention pertains to a preamplifier and more specifically to a preamplifier for use with a hydrophone.

2. Description of Related Art

Hydrophone preamplifiers currently in use were designed utilizing technology that is twenty years old and even though they have undergone various modifications to the technology, the components utilized are not state-of-the-art. Within the art there exists a requirement for a hydrophone utilizing state-of-the-art electronic circuits and components.

Since the early 1960's, with the advent of thin- and thick-film integrated circuits, changes have been phenomenal in all areas of electronics. Microelectronics ushered in a new era of electronic design philosophy; multitudes of components, functions, and capabilities could be realized using three to five orders of magnitude in less physical space than prior circuitry. Integrated-logic circuits became the building blocks for digital systems, and the integrated operational amplifier (op-amps) became the building block for analog functions.

In the 1960'users of hydrophones began to phase out the tube-type preamplifiers and began to use solid-state devices. This came as a result of the proven reliability and effectiveness of the field-effect-transistor (FET) in high-impedance-input preamplifiers. By the late 1960's discrete-component solid-state designs had become the norm for standard hydrophone preamplifiers.

By the 1970's integrated circuit (IC) technology had advanced to the point that a variety of analog devices could be used in hydrophone preamplifiers. Many devices were used, but their roles have been relegated to such functions as second and succeeding amplifier stages, voltage regulators, and line drivers. In general, IC op-amps fail to perform satisfactorily with reactive inputs and have very high self-noise compared to a discrete-FET input circuit. The latter disadvantage appears to be an innate failure of all IC op-amps. To meet requirements for hydrophones that were more sensitive to sea changes, the increase in amplification brought with it an increase in noise level.

The space-saving advantages of IC's for low-noise hydrophone applications can be realized by the use of a custom-manufactured hybrid microelectronics. Performance of the hybrid, including self-noise, can be equal to or superior to its discrete-component counterpart.

SUMMARY OF THE INVENTION

The object of this invention is to provide a preamplifier utilizing modern electronics technology that is a direct replacement for the preamplifiers currently in use.

Another objective is to provide a preamplifier having improved reliability and ease of utilization.

These and other objectives are achieved by a preamplifier design utilizing hybrid integrated circuits, surface mounted components, multi-layered circuit boards and gain switching. Acoustic signals from a sensor are applied to a hybrid integrated circuit preamplifier. Protection against transient voltages is supplied by a plurality of transistors utilizing an emitter to collector circuit in its silicon form as a zener diode in series with a rectifier diode to maintain the input level within the safe operating level of the hybrid integrated circuit. The preamplifier in the hybrid integrated circuit provides a gain of 10 (20 dB) and an additional gain of 10 is provided by a lownoise operational amplifier (op amp). The ac coupling between the stages ensures that the signal is centered within the op amp circuit's common mode range. A current booster provides the output current drive capability for the preamplifier which is capable of driving large capacitive loads and has protection against both electrical and thermal overloads.

An insertion calibration is provided through an ac current signal supplied by an external source, which develops a small voltage signal when applied to the preamplifier. The voltage signal is coupled through an acoustic sensor to the preamplifier input. Gain control is provided by a relay which is energized by 24 volts dc on the gain control line from an external source and switches a capacitive load across the sensor. A capacitive voltage divider is formed which is constant over a specified bandwidth yielding a desired attenuation.

DESCRIPTION OF THE PREFERRED EMBODIMENT

Figure 1:
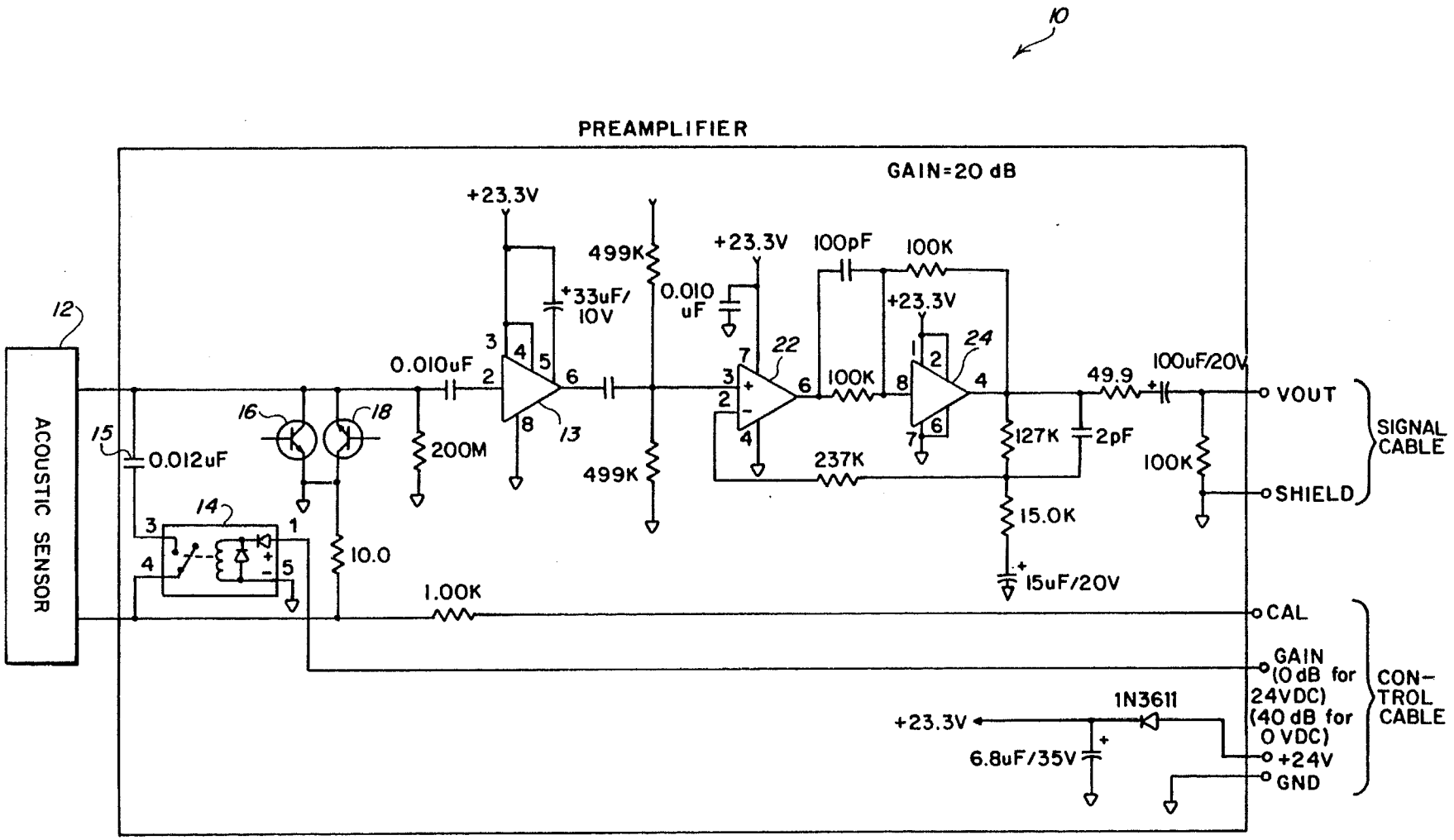
FIG. 1 is a schematic of a preamplifier circuit.

The hydrophone preamplifier 10, as shown in FIG. 1, is a preamplifier utilizing a hybrid preamplifier within a hybrid integrated circuit (IC) 13 which is used to amplify electrical signals from an acoustic sensor 12

Electrical signals from the acoustic sensor 12 are applied to a hybrid integrated circuit (IC) 13 which is protected from transient voltages by a pair of NPN transistors 16 and 18, such as part no. 2N3904, manufactured by National Semiconductor Corp. of Mt. Prospect, Ill., where the emitter to collector circuit in its silicon form is used as a zener diode in series with a rectifier diode. Transients greater than 6 Vdc cause zener (base to emitter) current to flow through one of the transistors 16 or 18 and therefore clamps the voltage. This maintains the input voltage level from the sensor 12 within safe operating levels for the hybrid IC 13.

The hybrid IC 13 provides a gain of 10 (20 dB) and is followed by a low-noise operational amplifier (op-amp) 22 for an additional gain of 10, giving a total voltage gain of 100 (40 dB). The ac coupling between stages ensures the signal is centered within the op-amp 22, such as part no. AD745BQ manufactured by Analog Devices of Norwood, Mass., circuit's common mode range. A current booster 24, such as part no. LM6121H/883 manufactured by National Semiconductor Corp., provides the output current drive capability for the preamplifier 10. The preamplifier 10 is capable of driving large capacitive loads and is protected against electrical and thermal overloads by internal circuitry.built into the current booster.

The hydrophone preamplifier 10 can be calibrated by the insertion of an alternating current signal from an internal source to develop a small voltage signal in the preamplifier 10. The voltage signal is then coupled through the acoustic sensor 12 to the preamplifier input. Nominally, a 1 mA rms calibration signal will develop a 10 mV rms input.signal, resulting in a 1 V rms output signal from the preamplifier 10. The calibration feature provides a complete loop-back system test for the preamplifier.

Gain control is provided by a relay 14. The presence of a 24 V dc on the gain control line will energize the relay 14 and switch a capacitive load 15 across the sensor 12. In effect, a capacitive voltage divider is formed which is constant over a preselected bandwidth. The value of the capacitive load 15 is selected to yield the desired attenuation. For a −40 dB attenuation a 0.012 μF capacitor is utilized. The gain switching permits measurement of high sound pressure levels (low gain) and low ambient noise levels (high gain). The gain control can be used with solid state relays as long as the sensor 12 capacitance is significantly higher than 124 pF.

An interconnecting transmission cable (not shown) between the surface control (not shown) and the preamplifier 10 conducts the output signal of the preamplifier 10 to the control (not shown), calibration signal, gain control and power for the preamplifier.

Figure 2:
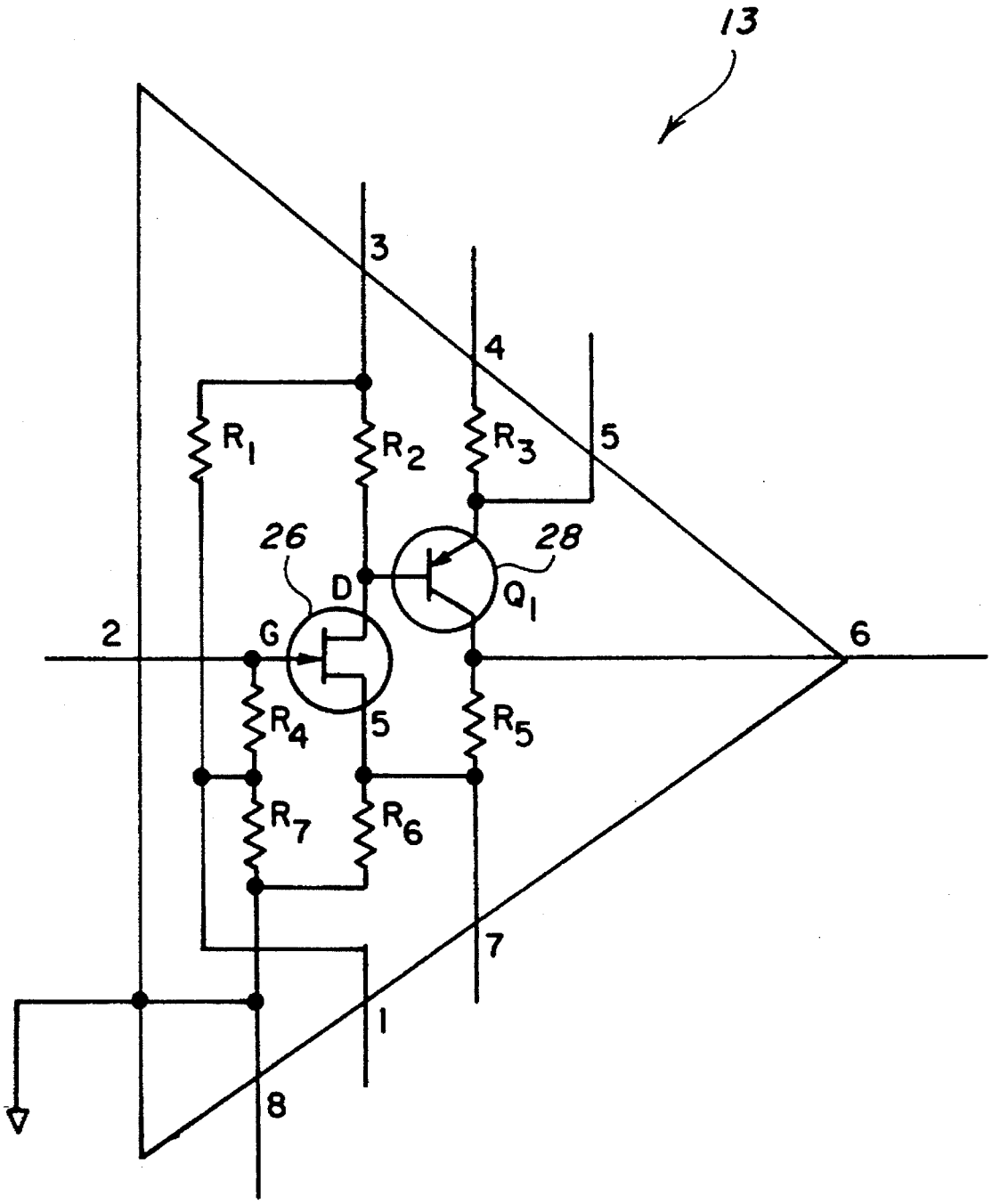
FIG. 2 is a schematic of a hybrid integrated circuit utilized in the preamplifier circuit.

Now referring to FIG. 2, the hybrid IC 13, part no. USRD 752A, manufactured by Eltec Industries, Inc. of Datona Beach, Fla. was developed by the Naval Research Laboratory-Underwater Sound Reference Detachment and is described in Brown et al., *Hydrophone Preamplifier Optimization-Hybrid Microelectronics for Low-Noise Hydrophones*, NRL Rpt FR-8218, Oct. 1987. The preamplifier of the hybrid IC 12 has two stages. The input stage is a low-noise junction field-effect transistor (JFET) 26. The circuit is designed so that the gate-to-source and gate-to-drain junctions are reverse biased. This means that the JFET 26 appears to be an open circuit when viewed from its gate terminal. The leakage current flowing out of the gate is usually negligible, especially at the low temperatures encountered by hydrophones. High-frequency operation is enhanced and the effects of junction capacitances in the JFET 26 are reduced by a feedback network which forces the signal at the source and gate terminals to be nearly the same. The preamplifier output stage is formed by a transistor 28 which forms a common emitter stage whose output is fed back to the input stage. The negative direct-current (dc) feedback stabilizes the dc biasing of the circuit.

This invention provides a preamplifier utilizing modern electronics technology that is a direct replacement for the preamplifiers currently in use and has improved reliability and ease of utilization. The invention may be interfaced with existing control devices providing an integrated package that simplifies operation and improves reliability. The addition of a gain control provides a unique feature not found in the prior art allowing a gain of from 13 or 20 dB in to prior art to 40 dB in the described embodiment. The addition of the output driver allows longer cabling with minimal signal loss to be utilized between the preamplifier and the control. The described embodiment allows operation from 2 Hz to 600 kHz and a low input noise of −156 dB/√Hz for a 124 pF source is maintained.

Obviously, many modifications and variations of the present invention are possible in light of the above teaching. It is therefore to be understood that, within the scope of the appended claims, the invention may be practiced otherwise than as specifically described.

What is claimed is:

1. A hydrophone preamplifier comprised of:

an electrical input signal from an acoustic sensor;

a hybrid integrated circuit preamplifier receiving and first amplifying the electrical input signal;

means for providing an additional gain to the first amplified electrical signal so as to produce a second amplified signal;

means for boosting the current of the second amplified electrical signal to provide an output current drive to a transmission cable;

means for providing electrical power to the preamplifier;

means for calibrating the preamplifier by applying an alternating current signal through the acoustic sensor to the hybrid integrated circuit preamplifier; and means for controlling the gain of the electrical input signal applied to the hybrid integrated circuit preamplifier.

* * * * *